United States Patent
Namikawa et al.

[11] Patent Number: 6,086,701
[45] Date of Patent: Jul. 11, 2000

[54] PROCESS FOR THE PRODUCTION OF STAMPER

[75] Inventors: Makoto Namikawa; Koichi Hashimoto; Haruo Ioka; Yukari Konda, all of Osaka, Japan

[73] Assignee: Nitto Denko Corporation, Osaka, Japan

[21] Appl. No.: 09/035,145

[22] Filed: Mar. 5, 1998

[30] Foreign Application Priority Data

Mar. 6, 1997 [JP] Japan .................................... 9-051219

[51] Int. Cl.[7] .............................. B32B 31/16; G11B 3/00; C09J 7/02
[52] U.S. Cl. .......................... 156/247; 156/153; 156/154; 156/344
[58] Field of Search ..................... 156/153, 154, 156/247, 344

[56] References Cited

U.S. PATENT DOCUMENTS 5,209,027  5/1993  Ishida et al. .
5,466,325  11/1995  Mizuno et al. .......................... 156/344
5,759,336  6/1998  Yamamoto et al. ................. 156/344 X

FOREIGN PATENT DOCUMENTS 3-178054  of 0000  Japan .
3-178054  8/1991  Japan .
9-180270  7/1997  Japan .
10-36787  2/1998  Japan .
10-40591  2/1998  Japan .

*Primary Examiner*—Curtis Mayes
*Attorney, Agent, or Firm*—Sughrue, Mion, Zinn, Macpeak & Seas, PLLC

[57] ABSTRACT

In accordance with the production process according to the present invention, a stamper having a desired pattern for the formation of a disc board can be produced without worsening the working atmosphere or causing any other problems. A novel process for the production of a stamper for the formation of a disc board is provided, which comprises applying an adhesive tape to the surface of a stamper body on which an unnecessary resist remains, and then peeling the adhesive tape off the stamper body so that the unnecessary resist is transferred to the adhesive tape to remove itself from the stamper body.

4 Claims, 5 Drawing Sheets

PROCESS FOR THE PRODUCTION OF STAMPER

FIELD OF THE INVENTION

The present invention relates to a process for the production of a stamper which is used in molding a plastic disc board such as magnetic disc by an injection molding process.

BACKGROUND OF THE INVENTION

A process for the production of such a kind of a stamper generally comprises applying a photoresist to the surface of a glass substrate to form a photoresist layer, subjecting the coated material to heat treatment, cutting the coated material with Ar ion laser beam to form an indented pattern composed of pits or grooves as a latent image, and then developing the latent image to form a master stamper having an intended pattern provided on the surface thereof. The master stamper thus formed is subjected to sputtering, electroplating or the like to form a nickel layer thereon which is then peeled off the substrate to obtain a stamper body.

The stamper body has an unnecessary resist left attached to the surface thereof which is then cleaned away with an organic solvent such as acetone. Thereafter, the other surface of the stamper body is polished to prevent the generation of error signal. During this procedure, the stamper body has a liquid protective agent coated on the surface thereof to protect the pattern on the surface of the stamper body. The stamper body thus polished is punched at the periphery thereof to produce a stamper having a desired shape.

However, the production process is disadvantageous in that the removal of unnecessary resist with an organic solvent takes much time. Further, the use of an organic solvent worsens the working atmosphere and may cause ignition. The production process is also disadvantageous in that the protective agent which has been applied to the surface of the stamper body before polishing of the other surface thereof needs to be cleaned away, causing similar troubles. Moreover, when the surface of the stamper body thus comes in contact with the solvent or protective agent, the pattern on the surface of the stamper body gets out of shape, causing error in reading or noise generation.

SUMMARY OF THE INVENTION

It is therefore an object of the present invention to produce a stamper having a desired pattern shape for the formation of a disc board at a good working efficiency without causing a problem of deterioration of the working efficiency and working atmosphere and destruction of the pattern shape accompanying the removal of unnecessary resist or protective agent.

The object of the present invention will become more apparent from the following detailed description and examples.

The inventors made extensive studies to find a solution to these problems and found the following facts. Namely, when an unnecessary resist left attached to the stamper body is transferred to an adhesive tape, it is not necessary to clean the surface of the stamper body with an organic solvent. Further, when an adhesive tape is applied to the surface of the stamper body to protect the patterned surface of the stamper body before polishing of the other surface of the stamper body, it is not necessary to apply to the surface of the stamper body a protective agent which has heretofore been applied, eliminating the necessity of cleaning the protective agent away after polishing. This makes it possible to improve the working efficiency and working atmosphere and evade the possibility of ignition. Further, the pattern can be prevented from getting out of shape during cleaning or application of protective agent, making it possible to drastically reduce the possibility of error in reading or noise generation. Furthermore, the inventors found that the removal of unnecessary resist with an adhesive tape is combined with the protection of the patterned surface. While the other surface of the stamper body is being polished, the surface on which unnecessary resist is left attached is being protected by an adhesive tape. Thereafter, the adhesive tape is peeled off the surface of the stamper body so that the unnecessary resist is transferred to the adhesive tape. In this manner, the removal of unnecessary resist and the protection of the patterned surface can be accomplished at the same time by application and peeling of one adhesive tape. As a result, the working efficiency can be further improved.

The present invention has been worked out on the basis of the knowledge described above. Namely, the present invention provides a process for the production of a stamper for the formation of a disc board, which comprises applying an adhesive tape to the surface of a stamper body on which an unnecessary resist remains, and then peeling the adhesive tape off the stamper body so that the unnecessary resist is transferred to the adhesive tape to remove itself from the stamper body. The present invention also provides a process for the production of a stamper for the formation of a disc board, which comprises applying an adhesive tape to the face surface of a stamper body, and then polishing the back surface of the stamper body while protecting the face surface with the adhesive tape. The present invention further provides a process for the production of a stamper for the formation of a disc board, which comprises applying an adhesive tape to the face surface of a stamper body on which an unnecessary resist remains, polishing the back surface of the stamper body while protecting the face surface with the adhesive tape, and then peeling the adhesive tape off the stamper body so that the unnecessary resist is transferred to the adhesive tape to remove itself from the stamper body.

BRIEF DESCRIPTION OF THE DRAWINGS

By way of example and to make the description more clear, reference is made to the accompanying figures in which:

FIG. 7 is a sectional view illustrating the stamper body which an adhesive tape is applied to;

DETAILED DESCRIPTION OF THE INVENTION

Embodiments of the present invention will be described hereinafter in connection with the accompanying figures.

Figure 1:
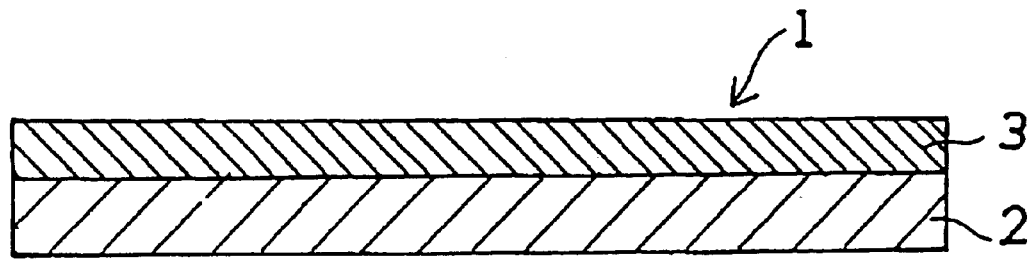
FIG. 1 is a sectional view illustrating an embodiment of the adhesive tape used in the present invention.

FIG. 1 illustrates an example of the adhesive tape used herein. The adhesive tape 1 is composed of a sheet-like substrate 2 and an adhesive layer provided thereon. The sheetlike substrate generally has a thickness of from 10 to 100 μm and is made of polyethylene, polyethylene terephthalate, acetyl cellulose, polycarbonate, polypropylene, nylon film or the like, and the adhesive layer generally has a thickness of from 5 to 100 μm.

The adhesive layer 3 is preferably made of various pressure-sensitive adhesive such as acrylic and rubber adhesives, particularly a curing type pressure-sensitive adhesive which cures when heated or irradiated with light. The curing type pressure-sensitive adhesive comprises a pressure-sensitive adhesive polymer and a nonvolatile compound containing one or more unsaturated double bonds per molecule incorporated therein. Thus, the curing type pressure-sensitive adhesive becomes fairly adhesive when it senses pressure because of the function of the pressure-sensitive adhesive polymer. Further, the curing type pressure-sensitive adhesive undergoes polymerization curing when heated or irradiated with light because of the presence of the nonvolatile compound.

As the pressure-sensitive adhesive polymer there may be used any of various known polymers. Particularly preferred among these polymers is an acrylic polymer comprising an acrylic acid alkyl ester and/or methacrylic acid alkyl ester as a main monomer. The acrylic polymer can be obtained by allowing the main monomer, i.e., ester of acrylic acid or methacrylic acid with an alcohol generally having 12 or less carbon atoms, and optionally a monomer having carboxyl group or hydroxyl group and other monomers for modification to undergo solution polymerization, emulsion polymerization, suspension polymerization, bulk polymerization or like polymerization by an ordinary method. The pressure-sensitive adhesive polymer which can be used in the present invention generally has a weight-average molecular weight of 10,000 to 1,000,000. The adhesive contains the pressure-sensitive adhesive polymer generally in an amount of from 30 to 90% by weight.

Examples of the carboxyl group-containing monomer include acrylic acid, methacrylic acid, maleic acid, and itaconic acid. Examples of the hydroxyl group-containing monomer include hydroxyethyl acrylate, and hydroxypropyl acrylate. Such a carboxyl group- or hydroxyl group-containing monomer is generally used in an amount of not more than 20% by weight based on the total weight of the monomers. Examples of the other monomers for modification include vinyl acetate, vinyl propionate, styrene, acrylonitrile, acrylamide, and glycidyl methacrylate. The other monomers for modification are generally used in an amount of not more than 50% by weight based on the sum of the weight of the main monomer and the other monomers for modification.

The adhesive tape is applied to the stamper body, whereby the stamper body or unnecessary resist and the adhesive are integrated. The nonvolatile compound incorporated in the pressure-sensitive adhesive polymer contributes to the integration and allows the adhesive to cure. Thus, the nonvolatile compound is preferably a compound containing one or more unsaturated double bonds which can cure when heated or irradiated with light per molecule and having a good affinity for the stamper body or unnecessary resist and a compatibility with the pressure-sensitive adhesive polymer good enough to prevent itself from flowing out during storage.

Examples of the nonvolatile compound include phenoxy-polyethylene glycol (meth)acrylate, ε-caprolactone (meth) acrylate, polyethylene glycol di(meth)acrylate, polypropylene glycol di(meth)acrylate, trimethylolpropane tri(meth) acrylate, dipentaerythritol hexa(meth)acrylate, urethane (meth)acrylate, epoxy (meth)acrylate, and oligoester (meth) acrylate. Among these nonvolatile compounds, one or more may be selectively used depending on the kind of the pressure-sensitive adhesive polymer. The amount of these nonvolatile compounds is generally from 20 to 200 parts by weight, preferably from 50 to 100 parts by weight, based on 100 parts by weight of the pressure-sensitive adhesive polymer.

The curing type pressure-sensitive adhesive preferably exhibits an enhanced cohesive force produced by crosslinking the pressure-sensitive adhesive polymer from the standpoint of applicability to the stamper body. For example, a polyisocyanate compound, a polyepoxy compound, various metal salts, a chelate compound or the like can be incorporated into an acrylic polymer obtained by the copolymerization of a carboxyl group- or hydroxyl group-containing monomer as a polyfunctional compound reactive with the functional group so that the reaction is accelerated during the production of the adhesive tape to effect the crosslinking of the polymer. It is generally preferred that such a polyfunctional compound be used in an amount of not more than 20 parts by weight based on 100 parts by weight of the pressure-sensitive adhesive polymer.

The curing type pressure-sensitive adhesive may further comprise a filler such as particulate silica incorporated therein for the same purpose as the polyfunctional compound. Moreover, the curing type pressure-sensitive adhesive may comprise various known additives such as tackifier resin, colorant and an age resistor incorporated therein as necessary. The amount of such an additive to be used may be ordinary.

The curing type pressure-sensitive adhesive, in which such various additives can be incorporated, can further comprise a polymerization initiator incorporated therein depending on the curing method. For example, if it is of thermocuring type, a heat polymerization initiator which produces a radical when heated, such as benzoyl peroxide and azobisisobutyronitrile, can be used. If it is of photocuring type which cures when irradiated with ultraviolet rays and the like, a photopolymerization initiator which produces a radical when irradiated with light, such as benzoin, benzoin ethyl ether and dibenzyl, can be used. Such a polymerization initiator can be used generally in an amount of from 0.1 to 10 parts by weight based on 100 parts by weight of the pressure-sensitive adhesive polymer.

Figure 2:
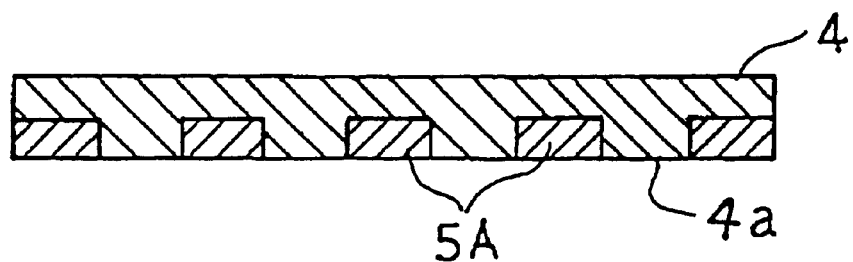
FIG. 2 is a sectional view illustrating an embodiment of the stamper body on which an unnecessary resist remains.
Figure 3:
FIG. 3 is a sectional view illustrating a glass substrate used in the preparation of the stamper body.
Figure 4:
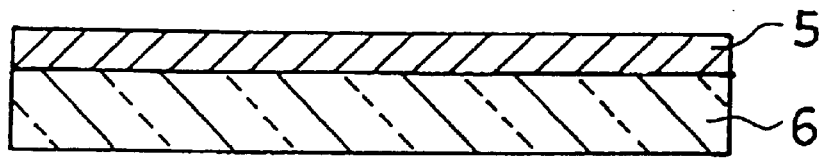
FIG. 4 is a sectional view illustrating a glass substrate having a resist layer formed on the surface.
Figure 5:
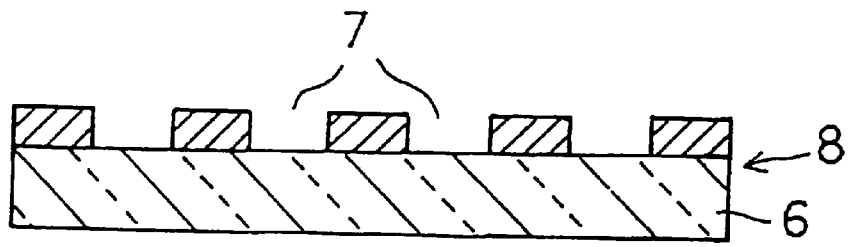
FIG. 5 is a sectional view illustrating the resist layer subjected to development.
Figure 6:
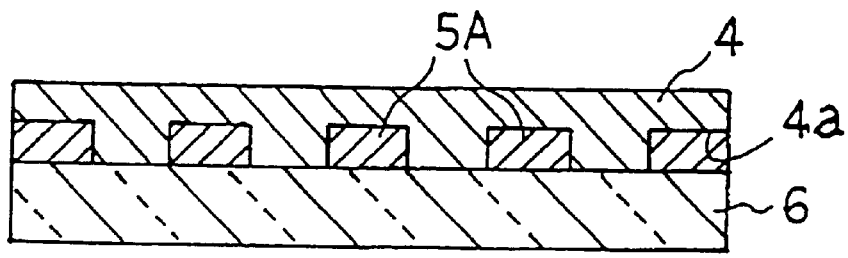
FIG. 6 is a sectional view illustrating the substrate having a nickel layer, obtained by forming the nickel layer on the substrate subjected to development.

FIG. 2 illustrates an embodiment of the stamper body on which an unnecessary resist remains. The stamper body comprises a nickel layer 4 on which an unnecessary resist 5A remains at the surface 4a (face surface) thereof. The stamper body is prepared by, e.g., a method shown in FIGS. 3 to 6. In some detail, a glass substrate 6 shown in FIG. 3 is used. A resist layer 5 made of a positive-working photoresist is formed on the glass substrate 6 as shown in FIG. 4. The glass substrate 6 is then subjected to an ordinary continuous processing involving heating, exposure and development to prepare a master stamper 8 having an indented pattern 7 composed of pits or grooves as shown in FIG. 5. The master stamper 8 is then subjected to electroplating to form a nickel layer 4 on the surface thereof as shown in FIG. 6. The nickel layer 4 is then peeled off the substrate 6. As a result, a stamper-body on which an unnecessary resist 5A remains at the surface 4a thereof is prepared.

Figure 7:
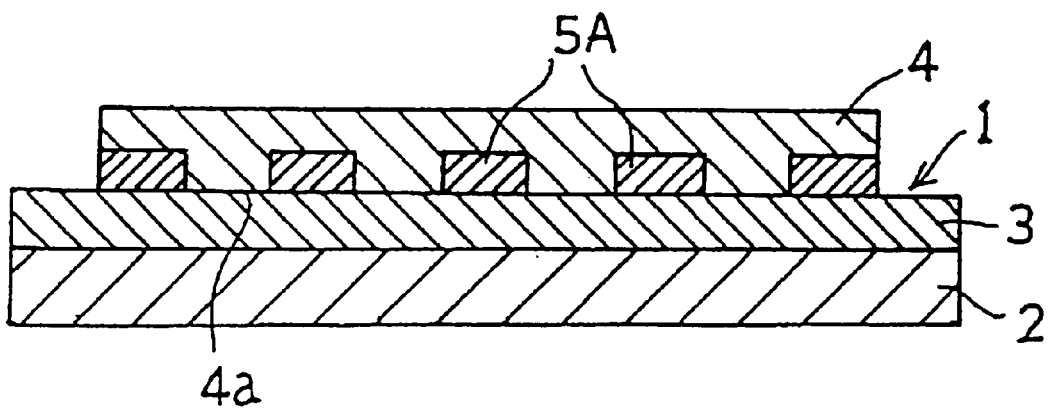
Figure 8:
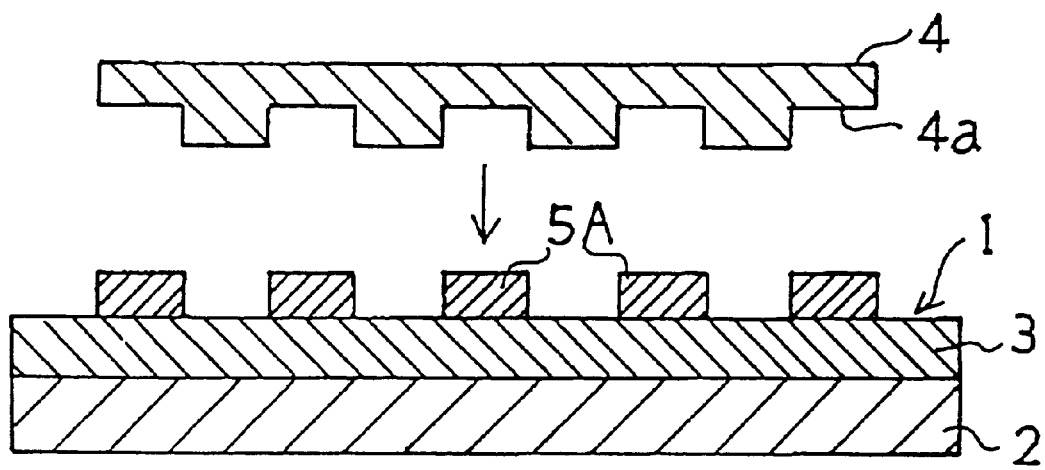
FIG. 8 is a sectional view illustrating the state in which the adhesive tape is peeled off the stamper body to remove the unnecessary resist from the surface of the stamper body.

FIGS. 7 and 8 illustrate the method of removing the unnecessary resist left attached from the surface of the stamper body by using the adhesive tape. Referring to this method, the adhesive tape 1 is applied to the surface 4a of the stamper body 4 so that the adhesive layer 3 is firmly bonded to the surface 4a and the unnecessary resist 5A as shown in FIG. 7. Subsequently, if the adhesive tape 1 is made of a curing type pressure-sensitive adhesive, the laminate is irradiated with ultraviolet rays or otherwise processed so that the adhesive layer 3 cures to have a high cohesive force and a low adhesion. The adhesive tape 1 is then peeled off the stamper body 4 so that the unnecessary resist 5A is transferred to the adhesive tape 1. Thus, the unnecessary resist 5A is removed away from the stamper body 4 as shown in FIG. 8.

In accordance with the present invention, the unnecessary resist 5A can be removed away with the adhesive tape 1, facilitating the removal operation as compared with the conventional method involving the cleaning with an organic solvent. Further, the working atmosphere can be kept good. There is no fear of ignition. Moreover, since the stamper body does not come in contact with any organic solvent, the patterned surface 4a does not get out of shape, making it possible to reduce error in reading or noise generation. The stamper body thus processed is then subjected to polishing on the other surface thereof, punching, etc. to produce a desired stamper.

Figure 9:
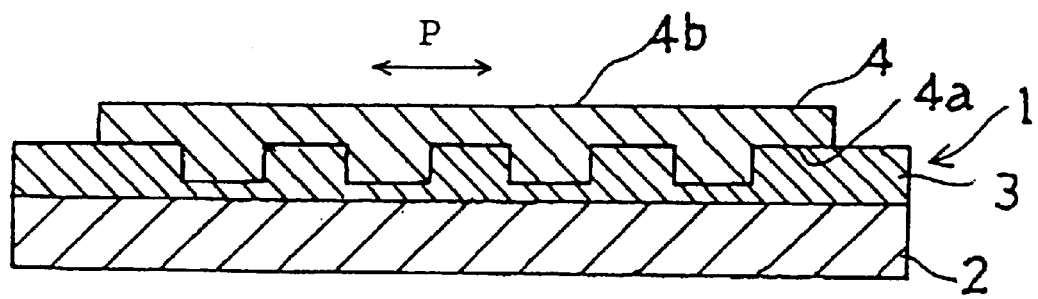
FIG. 9 is a sectional view illustrating the state in which the other surface of the stamper body is polished with an adhesive tape being applied the surface of the stamper body from which the unnecessary resist has been removed away.
Figure 10:
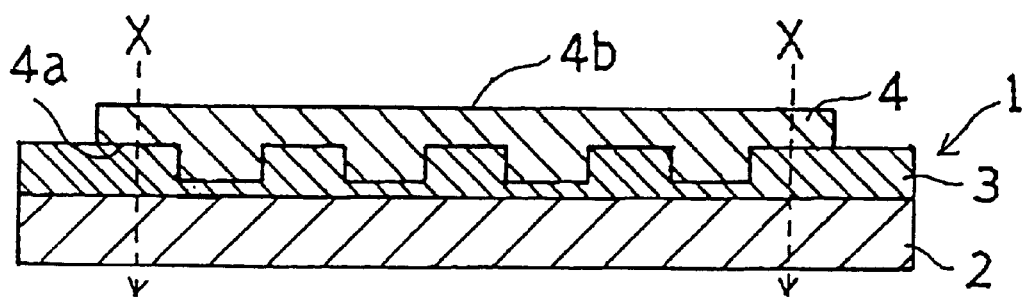
FIG. 10 is a sectional view illustrating the state in which the stamper body polished is punched.
Figure 11:
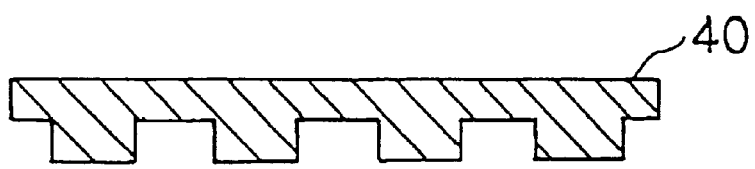
FIG. 11 is a sectional view illustrating a stamper obtained by peeling the adhesive tape from the stamper thus punched.

FIGS. 9 to 11 illustrate the methods of polishing the back surface of the stamper body and punching while using the adhesive tape. In accordance with this method, the adhesive tape 1 is applied to the surface 4a of the stamper body 4 from which the unnecessary resist has been removed away so that the surface 4a of the stamper body 4 is protected by an adhesive layer 3 and a sheet-like substrate 2. Under these conditions, the stamper body 4 is then polished on the other surface 4b (back surface) in the direction indicated by arrow P as shown in FIG. 9. The stamper body thus polished is then punched at its periphery through predetermined cutting lines X, X as shown in FIG. 10. Thereafter, if the adhesive tape is made of a curing type pressure-sensitive adhesive, the laminate is irradiated with ultraviolet rays or otherwise processed as mentioned above to cause the adhesive layer 3 to cure. The adhesive tape 1 is then peeled off the stamper body 4 to produce a stamper 40 having a desired external dimension as shown in FIG. 11.

As mentioned above, the adhesive tape 1 is applied to the surface 4a of the stamper body 4 so that the surface 4a can be protected during polishing of the other surface of the stamper body 4 and punching of the stamper body thus polished. Accordingly, there is no fear that the patterned surface 4a would get out of shape. Thus, error in reading or noise generation can be drastically lessened. Further, since this approach can be effected merely by applying and peeling the adhesive tape 1, it does not take much time unlike the conventional process involving the application and removal of a protective agent, making it possible to enhance the production efficiency.

The stamper body to be subjected to polishing on the other surface and punching may be a so-called master stamper from which an unnecessary resist has just been removed. Alternatively, the master stamper thus obtained may be processed according to an ordinary method to prepare a mother stamper on which a high purity nickel layer is formed to give a desired stamper body. For example, the surface of the master stamper from which an unnecessary resist has just been removed may be subjected to electroplating to form a nickel layer thereon. The nickel layer is then peeled off the master stamper to prepare a mother stamper. The surface of the mother stamper is then subjected to electroplating to form a nickel layer thereon. The nickel layer is then peeled off the mother stamper to prepare a stamper body comprising a high purity nickel layer.

Figure 12:
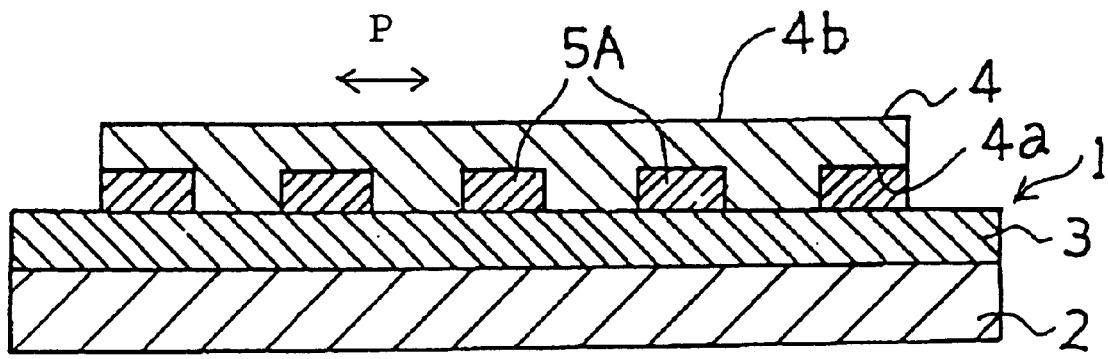
FIG. 12 is a sectional view illustrating the state in which the other surface of the stamper body is polished with an adhesive tape being applied to the surface of the stamper body on which an unnecessary resist remains.
Figure 13:
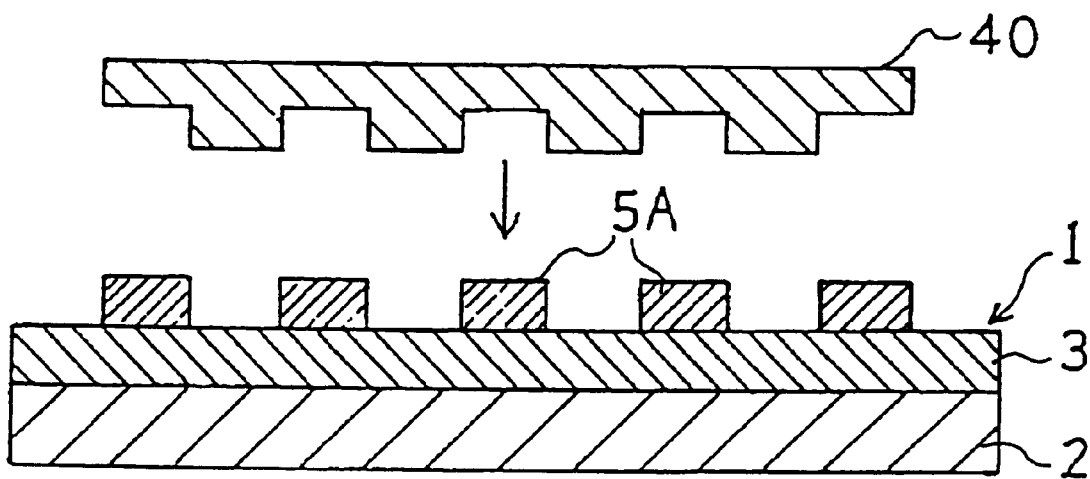
FIG. 13 is a sectional view illustrating the state in which the adhesive tape is peeled off the stamper body polished to remove the unnecessary resist therefrom and obtain a stamper.

FIGS. 12 and 13 illustrate the method of removing the unnecessary resist remaining on the face surface of a stamper body and polishing the back surface of the stamper body at the same time utilizing one adhesive tape. In accordance with this method, the adhesive tape 1 is applied to the surface 4a of the stamper body 4 on which an unnecessary resist 5A remains. The other surface 4b of the stamper body 4 is then polished in the direction indicated by arrow P while the surface 4a of the stamper body 4 is being thus protected as shown in FIG. 12. Thereafter, if the adhesive tape 1 is made of a curing type pressure-sensitive adhesive, the laminate is irradiated with ultraviolet rays in the same manner as mentioned above to cause the adhesive layer 3 to cure. The adhesive tape 1 is then peeled off the stamper body 4 to cause the unnecessary resist 5A to be transferred to the adhesive tape 1 so that the unnecessary resist 5A is removed away. As a result, a desired stamper 40 is prepared as shown in FIG. 13.

In accordance with the method, the stamper body can be polished on the other surface thereof with the patterned surface thereof being protected by an adhesive tape, followed by peeling of the adhesive tape accompanying the removal of the unnecessary resist. Accordingly, the production process can be further simplified as compared with the conventional method involving polishing on the other surface after removal of unnecessary resist. This method also provides further solution to the problem that the patterned surface gets out of shape, making it possible to further reduce error in reading or noise generation. In this method, too, if the stamper body is subjected to punching before curing by irradiation with ultraviolet rays and peeling, the patterned surface can be prevented from getting out of shape at this step.

The present invention will be further described in the following examples, but the present invention should not be construed as being limited thereto. The stamper body used hereinafter on which an unnecessary resist remains was prepared by the following method.

Preparation of Stamper Body

A positive-working photoresist was applied to the surface of a circular flat glass substrate having a diameter of 200 mm to form a resist layer having a thickness of 0.1 μm thereon.

The glass substrate was then subjected to an ordinary continuous processing comprising heating, exposure and development to form an indented pattern composed of pits or grooves on the surface of the glass substrate. Thus, a master stamper was prepared. The surface of the master stamper was then subjected to electroplating in a nickel sulfonate bath to form a nickel layer having a thickness of 0.3 mm thereon. The nickel layer thus formed was then peeled off the substrate to prepare a stamper body on which an unnecessary resist had remained.

EXAMPLE 1

A monomer mixture consisting of 80 parts by weight of n-butyl acrylate, 15 parts by weight of ethyl acrylate and 5 parts by weight of acrylic acid was allowed to undergo solution polymerization with 150 parts by weight of ethyl acetate and 0.1 parts by weight of azobis isobutyronitrile at a temperature of 60° C. in a nitrogen gas stream for 12 hours to obtain a solution of an acrylic polymer having a weight-average molecular weight of 560,000 and a glass transition point of 231K. To 250 parts by weight of the acrylic polymer solution thus obtained (which responds to 100 parts by weight of the polymer) were then added 100 parts by weight of urethane acrylate (UA-101H, available from Kyoeisha Chemical Co., Ltd.), 3 parts by weight of benzyl dimethyl ketal and 3 parts by weight of diphenyl methane diisocyanate. The mixture was then thoroughly stirred to obtain a curing type pressure-sensitive adhesive solution. Subsequently, the curing type pressure-sensitive adhesive solution was applied to the surface of a sheet-like substrate made of a polyethylene film having a thickness of 50 $\mu$m to provide a dry thickness of 40 $\mu$m. Thus, an adhesive tape was prepared.

Subsequently, the adhesive tape thus obtained was applied to the surface of the stamper body at a temperature of 80° C. under a pressure of 5 kg/cm$^2$ at an application rate of 10 mm/sec. Thereafter, the laminate was irradiated with ultraviolet rays of 365 nm in an integrated amount of 1,000 mW/cm$^2$. The adhesive tape was immediately peeled off the stamper body at a peeling rate of 30 mm/sec. As a result, the unnecessary resist was transferred to the adhesive tape to remove itself from the stamper body. The surface of the stamper body was then observed under an optical microscope at a magnification of 100. As a result, neither unnecessary resist nor adhesive layer was observed left on the stamper body.

EXAMPLE 2

The same adhesive tape as prepared in Example 1 was applied to the surface of the stamper body in the same manner as in Example 1. The obtained stamper body was then uniformly polished on the other surface thereof to a depth of 50 mm. Thereafter, the adhesive layer in the adhesive tape was irradiated with ultraviolet rays of 365 nm in an integrated amount of 1,000 mW/cm$^2$. The adhesive tape was immediately peeled off the stamper body at a peeling rate of 30 mm/sec. As a result, the unnecessary resist was transferred to the adhesive tape to remove itself from the stamper body. Thus, a stamper having a desired pattern was prepared.

As mentioned above, the production process according to the present invention involves transferring the unnecessary resist left on the stamper body to an adhesive tape to remove the unnecessary resist therefrom. The production process according to the present invention also involves polishing of the other surface of the stamper body while the surface thereof is being protected by the adhesive tape. In this manner, the working efficiency and working atmosphere can be improved. Further, the possibility of ignition can be eliminated. Moreover, the patterned surface of the stamper body can be prevented from getting out of shape, making it possible to lessen error in reading or noise generation. The production process according to the present invention also involves polishing of the other surface of the stamper body while the patterned surface on which the unnecessary resist remains is being protected by an adhesive tape, followed by peeling of the adhesive tape, to accomplish both the removal of unnecessary resist and the protection of patterned surface at the same time by the application and peeling of one adhesive tape. Thus, better results in the improvement of working efficiency can be provided.

While the invention has been described in detail and with reference to specific embodiments thereof, it will be apparent to one skilled in the art that various changes and modifications can be made therein without departing from the spirit and scope thereof.

What is claimed is:

1. A process for the production of a stamper for the formation of a disc board, which comprises:

applying an adhesive tape to the surface of a stamper body on which unnecessary resist remains;

protecting the face surface with the adhesive tape while the back surface of the stamper body is being polished; and peeling the adhesive tape off the stamper body so that the unnecessary resist is transferred to the adhesive tape and removed from the stamper body.

2. The process of claim 1, wherein the adhesive tape comprises a substrate having formed thereon an adhesive comprising an acrylic polymer and a non-volatile compound having one or more unsaturated double bonds per molecule.

3. A process for the production of a stamper for the formation of a disc board, which comprises:

applying an adhesive tape to the face surface of a stamper body on which an unnecessary resist remains;

polishing the back surface of the stamper body;

protecting the face surface with the adhesive tape while the back surface of the stamper body is being polished:

peeling the adhesive tape off the stamper body so that the unnecessary resist is transferred to the adhesive tape and removed from the stamper body.

4. The process of claim 3, wherein the adhesive tape comprises a substrate having formed thereon an adhesive comprising an acrylic polymer and a non-volatile compound having one or more unsaturated double bonds per molecule.

* * * * *